US010314142B2

(12) United States Patent
Miyazaki (10) Patent No.: US 10,314,142 B2
(45) Date of Patent: Jun. 4, 2019

(54) APPARATUS AND METHOD FOR DETECTING POSITION, EXPOSURE APPARATUS, AND METHOD FOR THE SAME

(71) Applicant: CANON KABUSHIKI KAISHA, Tokyo (JP)

(72) Inventor: Tadaki Miyazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 120 days.

(21) Appl. No.: 15/242,230

(22) Filed: Aug. 19, 2016

(65) Prior Publication Data

US 2017/0060003 A1   Mar. 2, 2017

(30) Foreign Application Priority Data

Aug. 25, 2015 (JP) .................................. 2015-166056

(51) Int. Cl.
G03F 9/00 (2006.01)
H05B 37/02 (2006.01)
G01B 11/14 (2006.01)

(52) U.S. Cl.
CPC ......... *H05B 37/0227* (2013.01); *G01B 11/14* (2013.01); *G03F 9/7065* (2013.01)

(58) Field of Classification Search
CPC ................................................... G03F 9/7088
See application file for complete search history.

(56) References Cited

U.S. PATENT DOCUMENTS

2004/0066285 A1* 4/2004 Sekiguchi .......... B60K 31/0008
340/435
2008/0258044 A1* 10/2008 Schrey ................. H04N 5/3575
250/208.1

FOREIGN PATENT DOCUMENTS

| JP | H03-225815 A | 10/1991 |
|----|--------------|---------|
| JP | H07-167614 A | 7/1995 |
| JP | H11-195575 A | 7/1999 |
| JP | 2000-323394 A | 11/2000 |
| JP | 2010-258099 A | 11/2010 |

* cited by examiner

*Primary Examiner* — Thanh Luu
(74) *Attorney, Agent, or Firm* — Canon USA, Inc., IP Division (57) ABSTRACT

A position detecting apparatus that detects a position of an object by detecting a mark on the object includes a light receiving element, a control unit, a light source, and an adjusting unit. The light receiving element receives light from the mark and accumulates the light as signals. The control unit detects a position of the mark based on the light from the mark. The light source illuminates the mark. The adjusting unit adjusts an amount of light applied to the mark. The control unit determines the amount of the light from the mark based on the accumulated signals in parallel with a term during which the accumulated signals are transferred to the control unit. The control unit adjusts the amount of light applied to the mark based on the amount of the light from the mark or detects the position of the mark based on the light from the mark.

16 Claims, 8 Drawing Sheets

APPARATUS AND METHOD FOR DETECTING POSITION, EXPOSURE APPARATUS, AND METHOD FOR THE SAME

BACKGROUND

Technical Field

The present disclosure relates to an apparatus and a method for detecting the position of a mark on an object. The present disclosure also relates to an exposure apparatus and a method for exposing a substrate after aligning the substrate using the position of the mark detected by the position detecting apparatus.

Description of the Related Art

With the trend toward miniaturization (high integration) of semiconductor devices, exposure apparatuses (semiconductor exposure apparatuses) are also required to have high accuracy and high performance. In particular, alignment of an original, such as a mask or a reticle, with a semiconductor wafer should have high accuracy because it has direct influence on the performance of the exposure apparatus. In addition to the high alignment accuracy, exposure apparatuses are also required to have improved throughput (the number of substrates processed in unit time) in view of production efficiency.

To accurately align an original with a substrate, it is important to capture an image of a mark (an alignment mark) formed on the object to be measured (for example, a substrate) under optimum conditions using an image capturing unit (a sensor). For example, a semiconductor wafer to be measured differs in reflectance according to the front-end processes. For this reason, capturing an image of the mark under optimum conditions needs to adjust the amount of light for illuminating the mark and the amount of light that the sensor receives from the mark. To adjust the amount of illumination light, a known exposure apparatus adjusts the amount of passing light by mechanically driving a neutral density (ND) filter (Japanese Patent Laid-Open No. 3-225815). Another known exposure apparatus adjusts the amount of light to be received by repeating illumination, light reception, and measurement of the amount of light while changing the time during which a sensor receives the light from the mark (Japanese Patent Laid-Open No. 11-195575).

The known exposure apparatuses determine whether the amount of light from the mark received by the sensor is appropriate. If it is inappropriate, the exposure apparatuses adjust the amount of light. In contrast, if the amount of light received by the sensor is appropriate, the exposure apparatuses start to measure the mark after checking the amount of light. This has the problem of delaying the time to start to measure the mark.

SUMMARY

The present disclosure provides a position detecting apparatus that detects a position of an object by detecting a mark on the object includes a light receiving element, a control unit, a light source, and an adjusting unit. The light receiving element receives light from the mark and accumulates the light as signals. The control unit detects a position of the mark based on the light from the mark received by the light receiving element. The light source illuminates the mark. The adjusting unit adjusts an amount of light applied to the mark. The control unit determines the amount of the light from the mark based on the accumulated signals in a term overlapping with another term during which the accumulated signals are transferred to the control unit. The control unit adjusts the amount of light applied to the mark based on the amount of the light from the mark by controlling the adjusting unit or detects the position of the mark based on the light from the mark received by the light receiving element.

Further features of the present invention will become apparent from the following description of exemplary embodiments with reference to the attached drawings.

DESCRIPTION OF THE EMBODIMENTS

Embodiments of the present disclosure will be described in detail below with reference to the accompanying drawings. In the drawings, like components are given the same reference signs, and duplicated descriptions will be omitted.

First Embodiment

Position Detector

Figure 1:
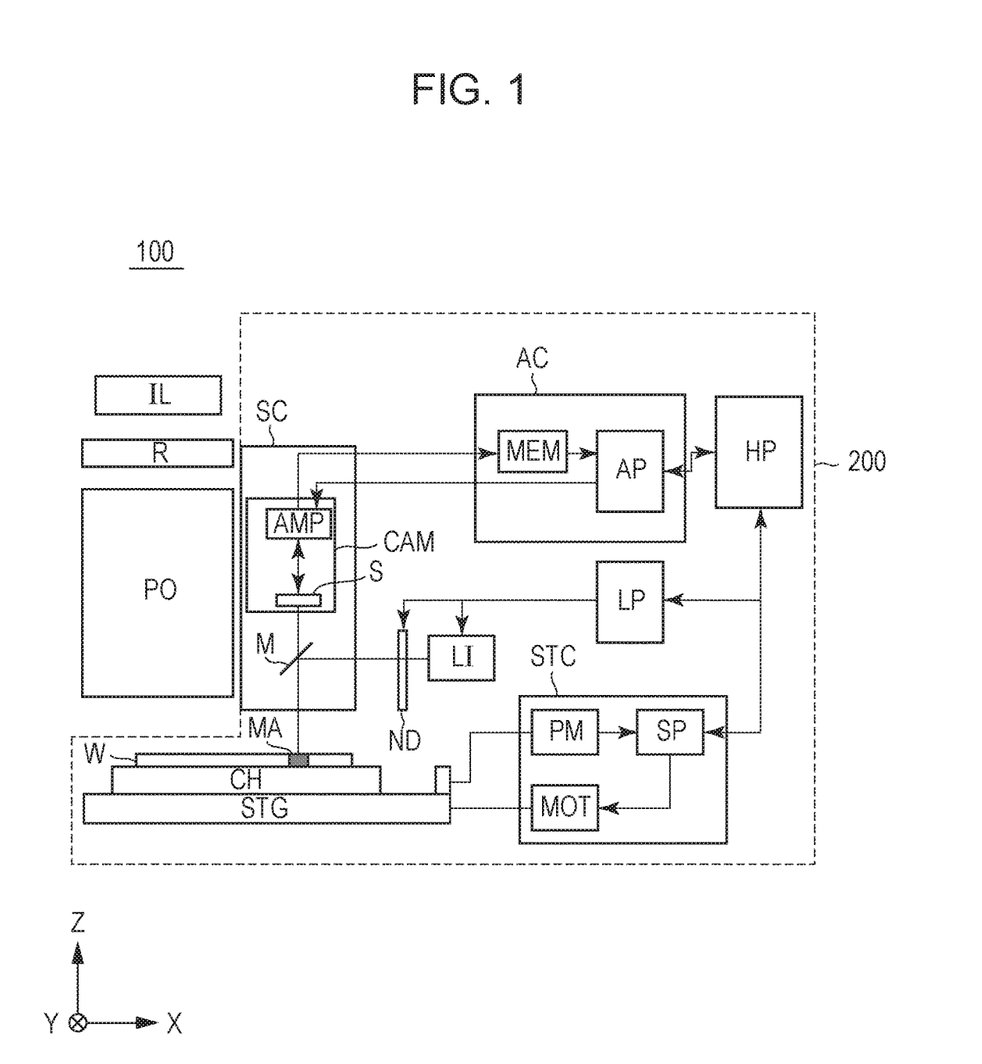
FIG. 1 is a diagram illustrating an exposure apparatus including a position detecting apparatus according to a first embodiment of the present disclosure.

A position detecting apparatus according to a first embodiment will be described. FIG. 1 is a diagram illustrating an exposure apparatus 100 including a position detecting apparatus 200 according to the first embodiment.

The exposure apparatus 100 according to the first embodiment aligns a reticle R (an original) and a wafer W (a substrate) and then irradiates the reticle R with exposure light using an illumination system IL to project a pattern of the reticle R to the wafer W using a projection optical system PO. The wafer W is held by a wafer chuck CH (a substrate holder). The wafer chuck CH is mounted on an X-Y stage STG that is movable in X-Y directions.

The wafer W has a mark MA (an alignment mark) formed thereon for aligning the wafer W. The exposure apparatus 100 includes an alignment scope SC serving as an image capturing unit for observing the mark MA. The exposure apparatus 100 further includes a light source LI for illuminating the mark MA. The amount of light from the light source LI is adjusted using a filter ND and is guided to a half mirror M by a fiber or an optical system (not shown). Light reflected by the half mirror M illuminates the mark MA via a projection optical system and so on (not shown). The illumination light is reflected by the wafer W in which the mark MA is formed. The light from the mark MA passes through the half mirror M and is received by a light receiving element S (a photosensor) in a mark imaging camera CAM (an image capturing unit). The light from the mark MA forms a mark image (an alignment mark image) on the light receiving element S. Examples of the light receiving element S include a CCD sensor and a CMOS sensor. Examples of the light source LI include a halogen lamp and a light emitting diode. Examples of the filter ND include a neutral density (ND) filter that reduces the amount of passing light and a wavelength filter that selects the wavelength of passing light. A plurality of filters ND having different transmittances are prepared. Using different filters ND allows the amount of illumination light to be adjusted. The light source LI and the filter ND are controlled by a light-amount adjusting unit LP (an adjusting unit). Although the light source LI and the filter ND are described as being separate from the alignment scope SC, the light source LI and the filter ND may be included in the alignment scope SC.

The light from the mark MA received by the light receiving element S is photoelectrically converted. The signal acquired by the photoelectrical conversion in the light receiving element S is converted from analog to digital by a sensor control unit AMP and is stored as digital signal information in a memory MEM. The digital signal information stored in the memory MEM is used to calculate the central position of the mark MA using an alignment processing unit AP. The time during which light is accumulated in the light receiving element S is transmitted from a host control unit HP (a control unit) that controls the overall position detecting apparatus 200 to the alignment processing unit AP in an alignment measuring unit AC (a control unit) serving as a unit for calculating the position of the mark MA and the amount of light. The light receiving element S is controlled by the sensor control unit AMP on the basis of the time during which light is accumulated in the light receiving element S, which is transmitted to the alignment processing unit AP. The timing to start accumulation of light in the light receiving element S is transmitted to the alignment processing unit AP by a stage processing unit SP in a stage control unit STC (a control unit) serving as a stage control unit and is then sent to the sensor control unit AMP. The stage processing unit SP drives the X-Y stage STG with a motor MOT and measures the position of the X-Y stage STG with a stage-position measuring unit PM (for example, an interferometer or an encoder).

The central position of the mark MA and the light amount calculated by the alignment processing unit AP are sent to the host control unit HP. The host control unit HP communicates the amount of light to the light-amount adjusting unit LP. The light-amount adjusting unit LP determines whether it is necessary to adjust the amount of light. If it is determined that the amount of light needs to be adjusted, the light-amount adjusting unit LP adjust the amount of light by controlling the light source LI and the filter ND. When it is determined that the amount of light needs to be adjusted, the host control unit HP may instruct the alignment processing unit AP to adjust the accumulation time of the light receiving element S via the sensor control unit AMP.

The exposure apparatus 100 is required to align a device pattern (a shot area) formed in the wafer W and a device pattern formed in a reticle (an original) in the order of nanometer. This requires high-accuracy detection of the position of the mark for alignment.

Method for Detecting Mark and Method of Alignment

Figure 2A:
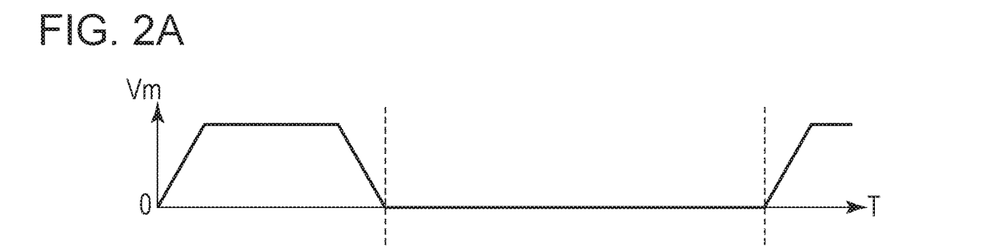
FIGS. 2A to 2C illustrate a timing chart for a method for detecting the position of a mark according to the first embodiment.
Figure 2B:
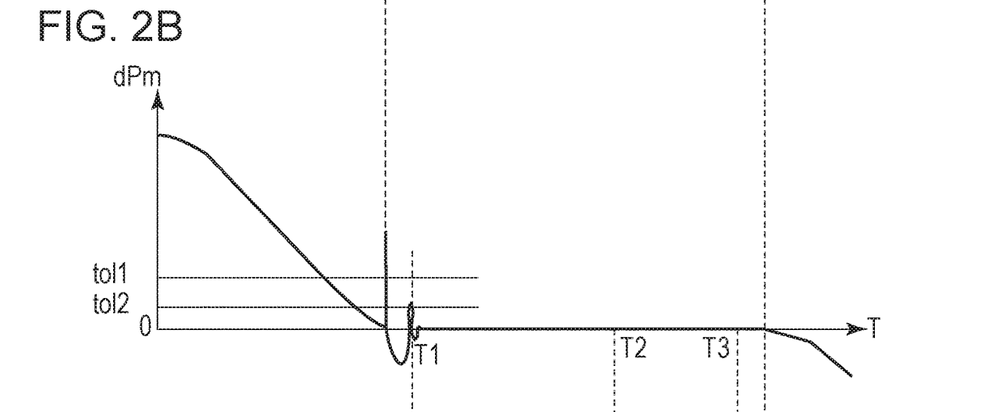
Figure 2C:
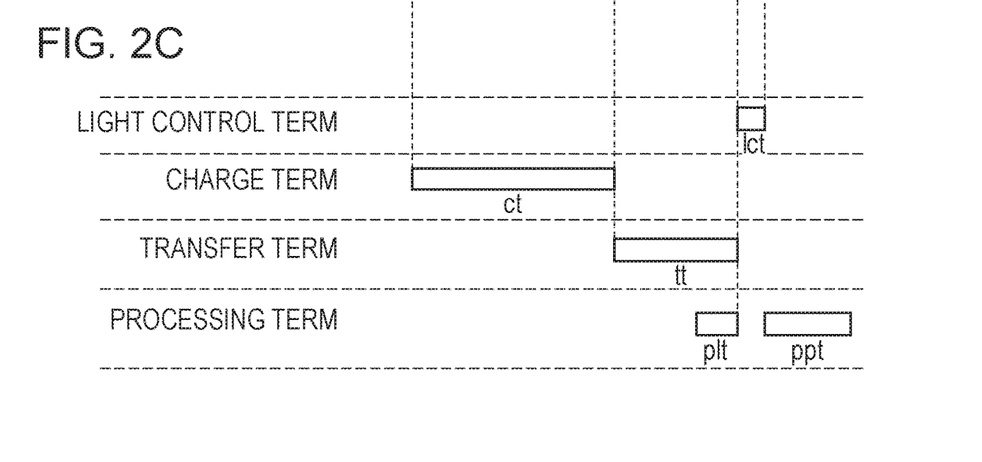
Figure 3:
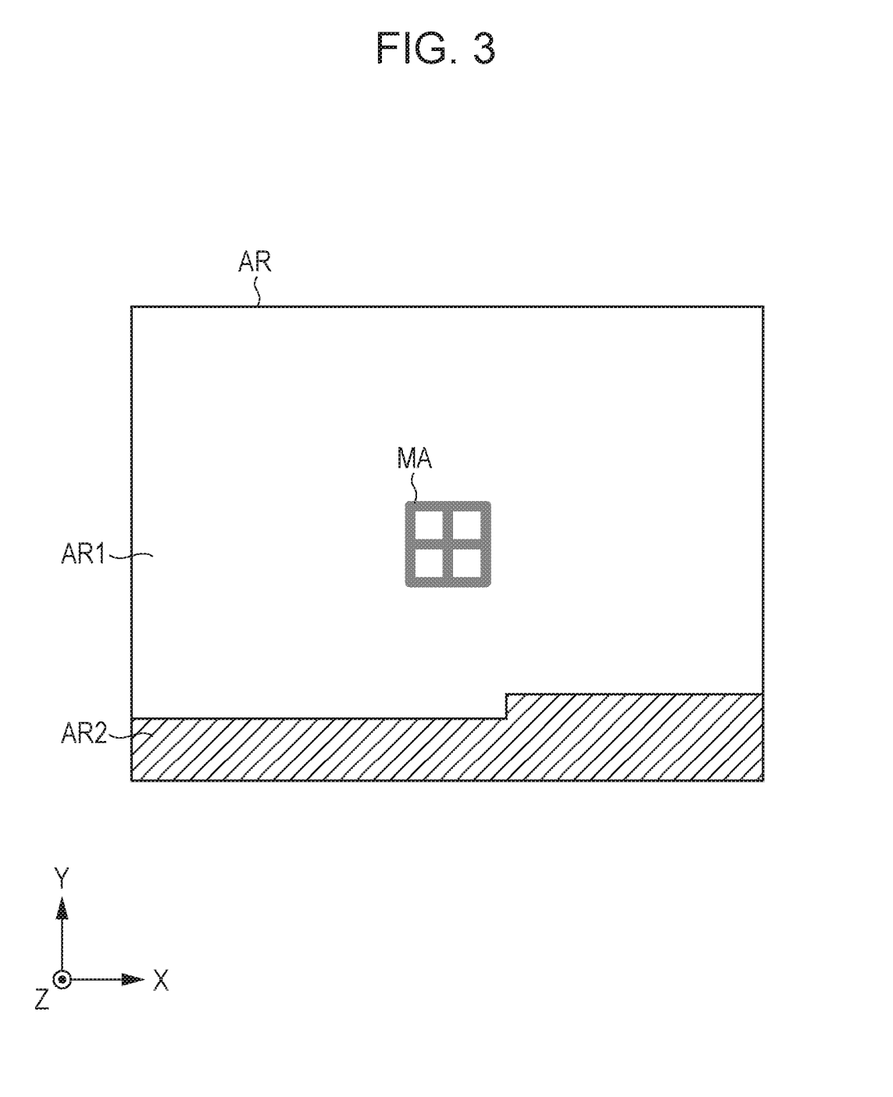
FIG. 3 is a diagram illustrating an image capturing area and a mark MA according to the first embodiment.

A method for detecting the mark MA using the position detecting apparatus 200 in the exposure apparatus 100 will be described with reference to FIGS. 2A to 2C and FIG. 3. FIGS. 2A to 2C illustrate a timing chart for adjusting light that illuminates the mark MA and for detecting the mark MA according to the first embodiment. FIG. 3 illustrates an image capturing area AR and a mark MA while the position detecting apparatus 200 is detecting the mark MA.

FIGS. 2A to 2C show a timing chart for the process of capturing an image of the mark MA formed in the wafer W using the light receiving element S, calculating the amount of light from the mark MA, determining whether to adjust the amount of light, and calculating the position. FIG. 2A illustrates the moving speed of the X-Y stage STG. In FIG. 2A, the vertical axis indicates the speed Vm of the X-Y stage STG, and the horizontal axis indicates time T. FIG. 2B illustrates a difference between the position of the X-Y stage STG and a target position of the moving X-Y stage STG. The vertical axis indicate the difference dPm, and the horizontal axis indicates time T. FIG. 2C is a timing chart for processes necessary for adjusting the amount of light and detecting the mark MA. The timing chart includes a light control term for determining whether to adjust the amount of light and adjusting the amount of light and a charge term for accumulating the light from the mark MA in the light receiving element S. The timing chart further includes a transfer term for transferring signals accumulated in the light receiving element S to the memory MEM and a processing term for acquiring the amount of light and the position of the mark MA from the transferred signals.

To measure the mark MA, first, the X-Y stage STG is moved to a target position so that the mark MA comes into the image capturing area (corresponding to the area AR in FIG. 3) of the alignment scope SC. To detect the mark MA using the light receiving element S, the position detecting apparatus 200 first confirms that the difference dPm of the X-Y stage STG is within a tolerance tol2 (a predetermined value) (time T1) and then starts to accumulate light in the light receiving element S. The value of the tolerance tol2 (a predetermined value) is the value of the difference dPm of the X-Y stage STG at which the position of the mark MA can be measured with high accuracy. Upon expiration of the charge term ct of the light receiving element S from the start of accumulation of light in the light receiving element S, the signals of the light accumulated in the charge term ct are transferred to the memory MEM (time T2).

The signals accumulated in the light receiving element S are stored in sequence in the memory MEM during a transfer term tt. A state in which signals in the light receiving element S are stored in sequence into the memory MEM will be described with reference to FIG. 3. FIG. 3 is a diagram illustrating the state of the memory MEM in which the signals are being transferred. The entire digital signal information on the mark MA that is captured using the light receiving element S and that is to be transferred to the memory MEM (the image capturing area AR, corresponding to the detection field of view of the alignment scope SC) includes an area AR1 that has already been transferred and an area AR2 that has not yet been transferred.

In the first embodiment, the amount of light is calculated by the alignment processing unit AP using the transferred digital signal information in the area AR1 during a light-amount calculation term plt overlapping with the transfer term tt. The light amount can be calculated using part of the signals accumulated in the light receiving element S. This allows calculation of the light amount (the light-amount calculation term plt) to be started midway through the transfer term tt.

While the timing chart of FIG. 2C illustrates a case in which both the transfer term tt and the light-amount calculation term plt end at time T3, the terms tt and plt may end at different times T. It is determined during a light-amount determination term lct whether to adjust the light amount on the basis of time T3 at which the light-amount calculation term plt ends and a desired light mount which is calculated in advance. The determination of whether to adjust the light amount is performed by the light-amount adjusting unit LP. The determination may be performed by the host control unit HP. If it is determined that light amount adjustment is not needed (the amount of the light from the mark is appropriate), the X-Y stage STG starts to move to the next target position. The light-amount determination term lct may overlap with transfer term tt. FIGS. 2A to 2C illustrate a case in which it is determined that light amount adjustment is not needed and in which the position of the mark MA is calculated during a mark-position calculation term ppt overlapping with driving of the X-Y stage STG. Since it is determined that light amount adjustment is not needed, the position of the mark MA can be calculated after expiration of the transfer term tt using the signals of light received by the light receiving element S, which are transferred to the memory MEM.

Next, a method for determining the timing to start the light-amount calculation term plt will be described. To minimize the waiting time from the end of the transfer term tt to the start of the light amount determination term lct, the light-amount calculation term plt has to be terminated by the end of the transfer term tt. If the amount of transferred signals is small, the accuracy of calculation of the light amount decreases. For this reason, the light-amount calculation term plt is terminated by the end of the transfer term tt using as much digital signal information as possible. To this end, the time at which the amounts of signals transferred are equal is set to the start point of the light-amount calculation term plt on the basis of the relationship between the light-amount calculation speed of the alignment processing unit AP and the signal transfer speed of the sensor control unit AMP. For example, the amount of signals Dp that can be processed during the light-amount calculation term plt is obtained from the relationship between the light-amount calculation speed and the light-amount calculation term plt. Furthermore, the amount of signals Dt that can be transferred during a term (tt–plt), which is obtained by subtracting the light-amount calculation term plt from the transfer term tt, is obtained from the relationship between the signal transfer speed and the term (tt–plt). The start point of the light-amount calculation term plt is set to the time when the amount of signals Dp processed during the term plt and the amount of signals Dt transferred during the term tt–plt are as equal as possible to each other. The time at which both the transfer term tt and the light-amount calculation term plt may end at the same time T3, as shown in FIG. 2C.

Thus, in the light amount adjustment and the mark position detection of the position detecting apparatus 200 according to the first embodiment, the light amount is calculated midway through the mark transfer term tt overlapping with the transfer term tt. Calculating the light amount before completion of transfer of signals accumulated in the light receiving element S further reduces the time taken to complete the calculation from the start of the accumulation of light from the mark MA.

Second Embodiment

The first embodiment shows a case in which it is determined that light amount adjustment is not needed (the amount of the light from the mark is appropriate). The exposure apparatus generally continuously processes 25 wafers per lot. Wafers in the same lot are similar in process state. This eliminates the need for wafer-to-wafer light amount adjustment in many cases. Meanwhile, the first wafer in the lot can differ in process state from wafers in the preceding lot. This often requires light amount adjustment. Accumulation of light in the light receiving element S for determination of the light amount can be started when the difference dPm of the X-Y stage STG comes in the range of a tolerance tol1 (a predetermined value). The value of the tolerance tol1 (a predetermined value) has a difference larger than the difference of the tolerance tol2 at which the position of the mark MA can be measured with high accuracy. For this reason, when light amount adjustment is needed, starting accumulation of light after the value of the difference dPm reaches the tolerance tol2 can delay the time to detect the mark MA after the light amount adjustment is performed.

Figure 4A:
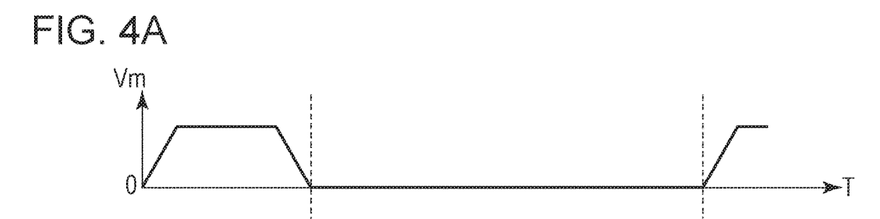
FIGS. 4A to 4C illustrate a timing chart for a method for detecting the position of a mark according to a second embodiment of the present disclosure.
Figure 4B:
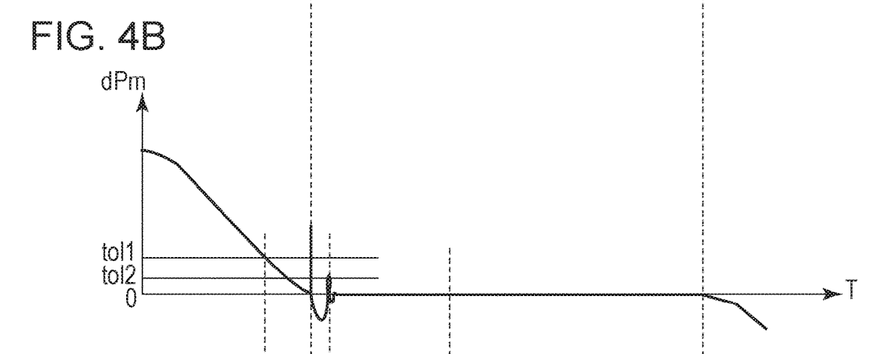
Figure 4C:
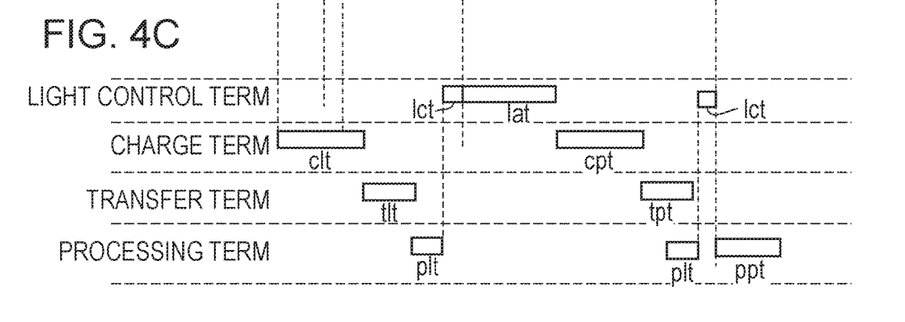

A second embodiment will be described with reference to FIGS. 4A to 4C. FIGS. 4A to 4C show a timing chart for a method for adjusting the light amount and a method for measuring the position of the mark MA according to the second embodiment.

In the second embodiment, for the first wafer in the lot, accumulation of light in the light receiving element S for determining the amount of light is started when the difference dPm of the X-Y stage STG enters the range of the tolerance tol1 (a charge term clt). Upon completion of the accumulation, transfer of signals (a transfer term tlt), calculation of the light amount (a light-amount calculation term plt), and determination of the light amount (the light-amount determination term lct) are performed in this order. If it is determined in the determination that light amount adjustment is needed, the amount of light is adjusted (a light-amount adjusting term lat). After the amount of light is adjusted, accumulation of light for determining the amount of light (a charge term cpt), transfer of signals (a transfer term tpt), calculation of the light amount (a light-amount calculation term plt), and determination of the light amount (the light-amount determination term lct) are performed in this order. The light-amount calculation term plt may be overlap with the signal transfer term tpt, as in the first embodiment. If it is determined that adjustment of the light amount is not needed as a result of the determination of the light amount (the light-amount determination term lct), driving of the X-Y stage STG is started to detect the next mark MA. Since the transfer of signals (the transfer term tpt) is completed, the mark-position calculation term ppt can overlap with the driving of the X-Y stage STG.

The method for adjusting the light amount and the method for measuring the position of the mark MA shown in FIGS. 4A to 4C are of a case in which it is determined in the first determination of the light amount that adjustment of the light amount is needed, and it is determined in the second determination that adjustment of the light amount is not needed. The calculation of the amount of light and the determination of the amount of light are repeated until an optimum light amount is obtained. When marks MA in a plurality of wafers in a lot are to be detected, the amount of light is often adjusted to an optimum amount in the first wafer. This allows mark detection using the method of the first embodiment without adjusting the amount of light for the second and subsequent wavers, allowing the original and the substrate to be aligned on the basis of the detection result.

This is the second embodiment of the present disclosure. In continuously processing wafers in a lot according to the second embodiment, for the first wafer that relatively needs light amount adjustment, accumulation of light is started when the difference dPm of the X-Y stage STG enters the range of the tolerance tol1. For the second and subsequent wafers, mark detection is performed by the method of the first embodiment. This reduces the time taken to determine the amount of light from the mark MA and to detect the mark MA.

Third Embodiment

Figure 5A:
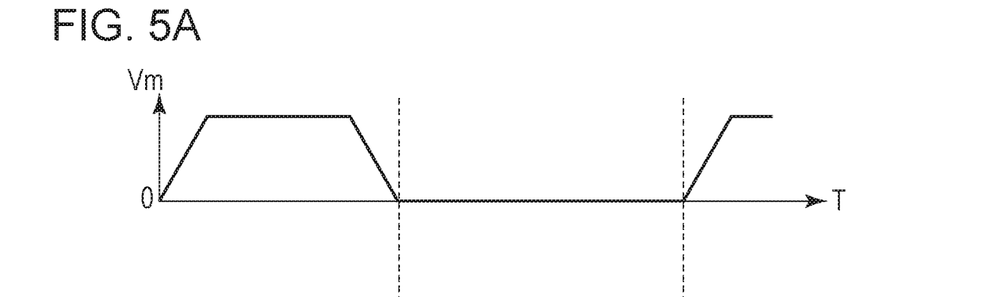
FIGS. 5A to 5C illustrate a timing chart for a method for detecting the position of a mark according to a third embodiment of the present disclosure.
Figure 5B:
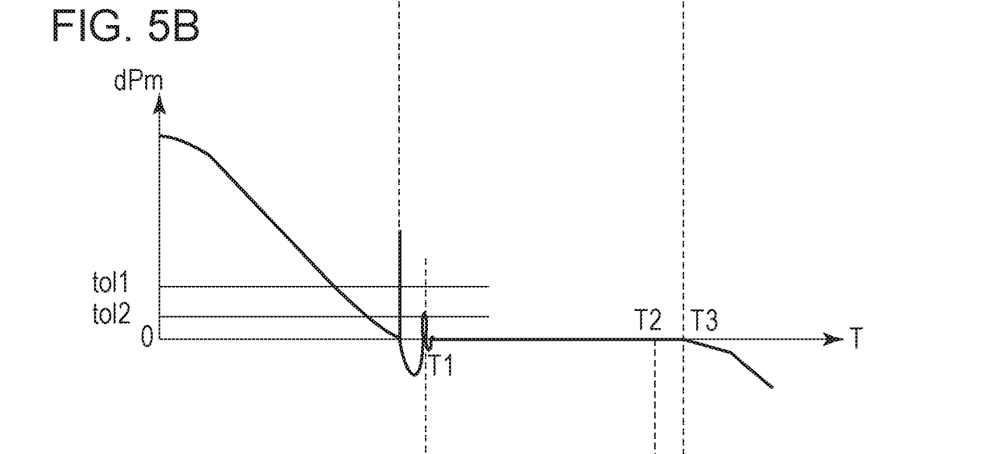
Figure 5C:
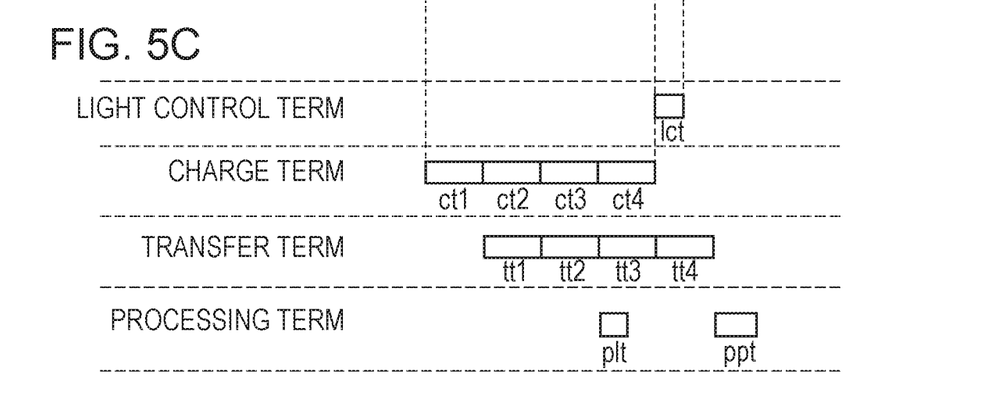

A third embodiment will be described with reference to FIGS. 5A to 5C. FIGS. 5A to 5C show a timing chart for a method for adjusting the amount of light and a method for measuring the position of the mark MA according to the third embodiment. The position detecting apparatus 200 according to the third embodiment enhances the accuracy of position measurement by receiving light from the mark MA a plurality of times (a plurality of image capturing operations) and averaging them. The third embodiment describes a case in which light from the mark MA is received with the light receiving element S a plurality of times to measure the position of the mark MA.

FIGS. 5A to 5C illustrate a timing chart in the case where the number of mark-image capturing operations is set to four. The number of image capturing operations is not limited to four and may be set to any number according to the accuracy of measurement. As in the first embodiment, accumulation of light in the light receiving element S is started (time T1) after it is determined that the difference dPm of the X-Y stage STG is within the range of the tolerance tol2 at which the position of the mark MA can be measured with high accuracy. The light receiving element S accumulates the light from the mark MA during four terms: charge terms ct1, ct2, ct3, and ct4. The sensor control unit AMP transfers sensor signals accumulated during the charge term ct1 to the memory MEM during a transfer term tt1. Similarly, the sensor control unit AMP transfers sensor signals accumulated during the charge term ct2 to the memory MEM during a transfer term tt2, sensor signals accumulated during the charge term ct3 to the memory MEM during a transfer term tt3, and sensor signals accumulated during the charge term ct4 to the memory MEM during a transfer term tt4.

In the third embodiment, the alignment processing unit AP calculates the amount of light using digital signal information transferred to the memory MEM during the transfer term tt1 and the transfer term tt2 overlap with the transfer term tt3 (a light-amount calculation term plt). The calculation of the amount of light can be performed by using part of the signals accumulated in the light receiving element S. This allows the calculation of the amount of light (the light-amount calculation term plt) to be performed overlapping with the transfer term tt3. While the third embodiment shows a case in which signal information corresponding to two images out of the four captured images, the number of pieces of signal information is not limited to two provided that signal information necessary for calculating the amount of light is acquired.

If the calculation result shows that adjustment of the light amount is not needed (the amount of the light from the mark is appropriate), the mark-position calculation term ppt for determining the position of the mark MA is started after the expiration of the last transfer term tt4. Thus, the calculation of the light amount (the light-amount calculation term plt) may be started before the last transfer term tt4 ends. Furthermore, the light-amount calculation term plt may be started before the charge term ct4 during which the mark MA is imaged last using the light receiving element S.

Upon the expiration of the last charge term ct4 (time T2), it is determined whether adjustment of the light amount is needed on the basis of the amount of light, which is calculated in advance during the light-amount calculation term plt (the light-amount determination term lct). If the determination shows that light amount adjustment is not needed, the X-Y stage STG is driven to the next target position (time T3). After the expiration of the last transfer term tt4, the position of the mark MA is calculated (the mark-position calculation term ppt) in parallel with the driving of the X-Y stage STG.

This is the third embodiment of the present disclosure. The third embodiment reduces the time taken to determine the amount of light by calculating the amount of light in parallel with the alignment-signal-information transfer term also when light from the mark MA is received a plurality of times using the light receiving element S.

Fourth Embodiment

Figure 6A:
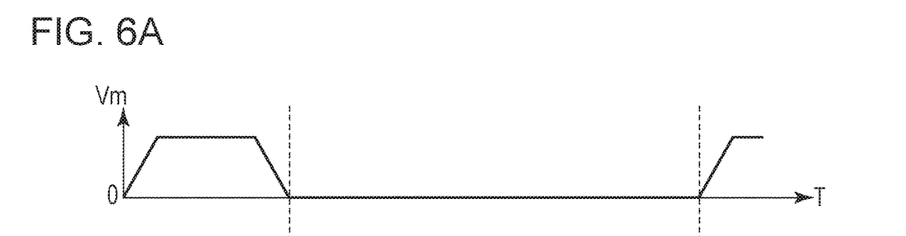
FIGS. 6A to 6C illustrate a timing chart for a method for detecting the position of a mark according to a fourth embodiment of the present disclosure.
Figure 6B:
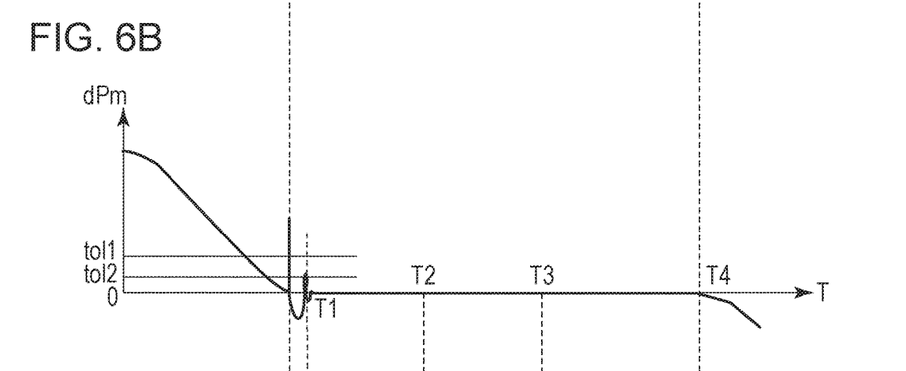
Figure 6C:
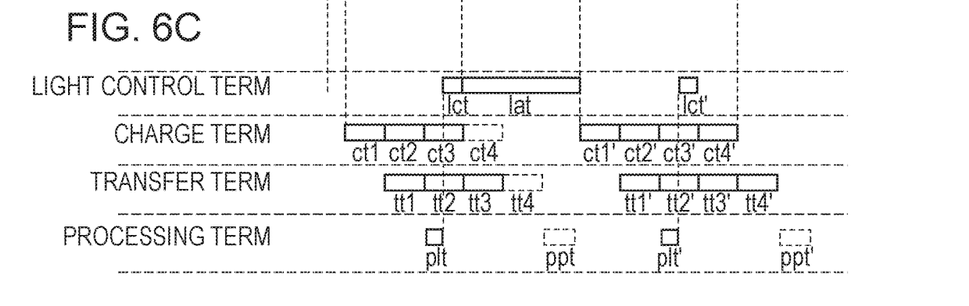

A fourth embodiment will be described with reference to FIGS. 6A to 6C. FIGS. 6A to 6C show a timing chart for a method for adjusting the amount of light and a method for measuring the position of the mark MA according to the fourth embodiment. While the third embodiment shows a case in which light amount adjustment is not needed, the fourth embodiment shows a case in which light amount adjustment is needed. FIGS. 6A to 6C show a timing chart for calculating the position of the mark MA by capturing four images of the mark MA, as in the third embodiment. The number of image capturing operations is not limited to four and can be set to any number according to the accuracy of measurement. As in the third embodiment, accumulation of light in the light receiving element S is started (time T1) after it is determined that the difference dPm of the X-Y stage STG is within the range of the tolerance tol2 at which the position of the mark MA can be measured with high accuracy. The sensor control unit AMP transfers sensor signals accumulated during a charge term ct1 to the memory MEM during the transfer term tt1.

In the fourth embodiment, the alignment processing unit AP calculates the amount of light using digital signal information transferred to the memory MEM during the transfer term tt1 overlapping with the transfer term tt2 (the light-amount calculation term plt). The calculation of the amount of light can be performed by using part of the signals accumulated in the light receiving element S. This allows the calculation of the amount of light to be performed in parallel with a transfer term tt2. While the fourth embodiment shows a case in which the amount of light is calculated during the light-amount calculation term plt using the digital signal information that is transferred first during the transfer term tt1, further signals accumulated in the light receiving element S may be used when signal information necessary for calculating the amount of light is not acquired.

The following is a description of a case in which the amount of light is calculated, and it is determined whether light amount adjustment is needed (the light-amount determination term lct), and In which the determination shows that light amount adjustment is needed. If it is determined that light amount adjustment is needed, the amount of illumination light is adjusted (a light-amount adjusting term lat) (time T2). Programmed accumulation of signals in the light receiving element S and transfer of sensor signals can be stopped (interrupted) in parallel with the light-amount adjusting term lat during which the amount of light is adjusted. In the case of the fourth embodiment, the charge term ct4 and the transfer term tt4 are interrupted. This is because, the signals accumulated in the light receiving element S during the charge terms ct1 to ct4 cannot be used to detect the position of the mark MA because it is determined that adjustment of illumination light is needed.

Upon expiration of the light-amount adjusting term lat in which the amount of light is adjusted, accumulation of signals in the light receiving element S is started again (time T3). The accumulation of signals in the light receiving element S is performed in the order of charge terms ct1', ct2', ct3', and ct4'. The amount of light subjected to light amount adjustment is calculated during a light-amount calculation term plt' using alignment signal information accumulated during the charge term ct1' and transferred during a transfer term tt1'. Upon completion of the calculation of the light amount, it is determined during a light-amount determination term lct' on the basis of the calculated amount whether light amount adjustment is needed. The calculation of the light amount parallel with the alignment-signal-information transfer term reduces the time necessary for checking the amount of light.

If it is determined that light amount adjustment is needed as a result of calculating the light amount and determining whether light amount adjustment is needed (the light-amount determination term lct'), light amount adjustment is performed again, and if it is determined that light amount adjustment is not needed, the position of the mark MA is calculated during a mark-position calculation term ppt'. FIGS. 6A to 6C show a case in which it is determined during the light-amount determination term lct' that light amount adjustment is not needed.

Upon expiration of the last charge term ct4', the X-Y stage STG starts to move to the next target position (time T4) because it is determined that light amount adjustment is not needed. Upon expiration of the last transfer term tt4', the position of the mark MA is calculated in parallel with the driving of the X-Y stage STG (the mark-position calculation term ppt').

This is the fourth embodiment of the present disclosure. The fourth embodiment reduces the time taken to determine the amount of light by calculating the amount of light in parallel with the alignment-signal-information transfer term also in the case where light from the mark MA is received a plurality of times using the light receiving element S for light amount adjustment.

Fifth Embodiment

Figure 7:
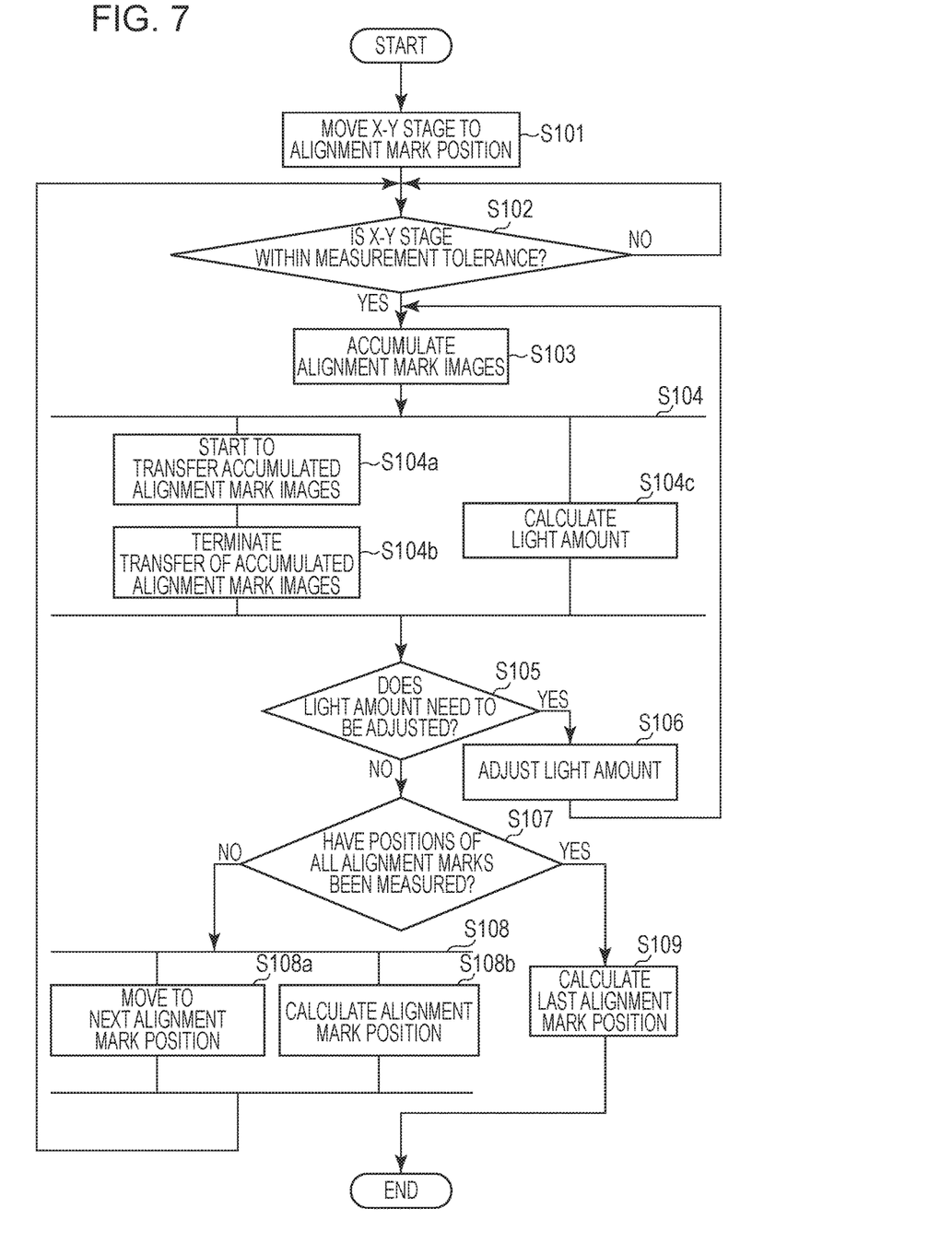
FIG. 7 is a flowchart for a method of detecting the position of a mark according to a fifth embodiment of the present disclosure.

A fifth embodiment will be described with reference to FIG. 7. FIG. 7 is a flowchart for a method of alignment according to the fifth embodiment. The fifth embodiment shows a method of alignment in the case where the positions of a plurality of marks in a wafer are measured.

First, at S101, the X-Y stage STG is moved to a target position so that the target marks MA are within an image capturing area (the field of view) of the alignment scope SC. At S102, it is determined whether the X-Y stage STG is positioned within the tolerance (tol2) in which the marks MA can be accurately measured. If at S102 it is determined that the X-Y stage STG (the marks MA formed in the wafer held on the X-Y stage STG) is positioned within the tolerance, then at S103 the light receiving element S accumulates mark images. If at S102 it is determined that the X-Y stage STG is not positioned within the tolerance, mark images are not accumulated, and the determination at S102 is repeated until it is determined that the X-Y stage STG is positioned within the tolerance.

Subsequently, at S104, the accumulated mark images are transferred, and the amount of light is calculated. At S104a, the sensor control unit AMP starts to transfer the mark images accumulated at S103 to the memory MEM, and at S104b the transfer ends. At S104c, the alignment processing unit AP calculates the amount of light using part of the mark images (digital signal information) transferred to the memory M by the end of the transfer of the mark images.

Upon completion of the transfer of the accumulated mark images and the calculation of the amount of light at S104, then at S105 it is determined whether adjustment of the light amount is needed on the basis of the calculate amount. The determination of whether the adjustment of the light amount is needed may be performed using either the light-amount adjusting unit LP or the host control unit HP.

If at S105 it is determined that adjustment of the light amount is needed (YES), then at S106 light amount adjustment is performed, and the processes from S103 to S105 are performed again. If at S105 it is determined that light amount adjustment is not needed (NO, the amount of the light from the mark is appropriate), then at S107 it is determined whether the positions of all of the plurality of marks MA in the wafer W have been measured. If at S107 it is determined that a mark MA to be measured remains (NO), then at S108 the X-Y stage STG is moved and the position of the mark MA is measured. At S108, the X-Y stage STG is moved to the position of the next mark MA at S108a, and the alignment processing unit AP calculates the position of the mark MA at S108b using the mark image in the memory MEM in parallel with the process at S108a. If at S107 it is determined that the positions of all the marks MA have been measured (YES), then at S109 the position of the last mark MA is calculated, and the position measurement ends.

After the position measurement, the host control unit HP aligns the X-Y stage STG on the basis of the acquired mark positions. Specifically, the stage control unit STC drives the X-Y stage STG.

This is the fifth embodiment of the present disclosure. The fifth embodiment reduces the time taken to determine the amount of light by calculating the amount of light in parallel with transfer of alignment signal information for measuring the positions of the marks MA.

Sixth Embodiment

Figure 8:
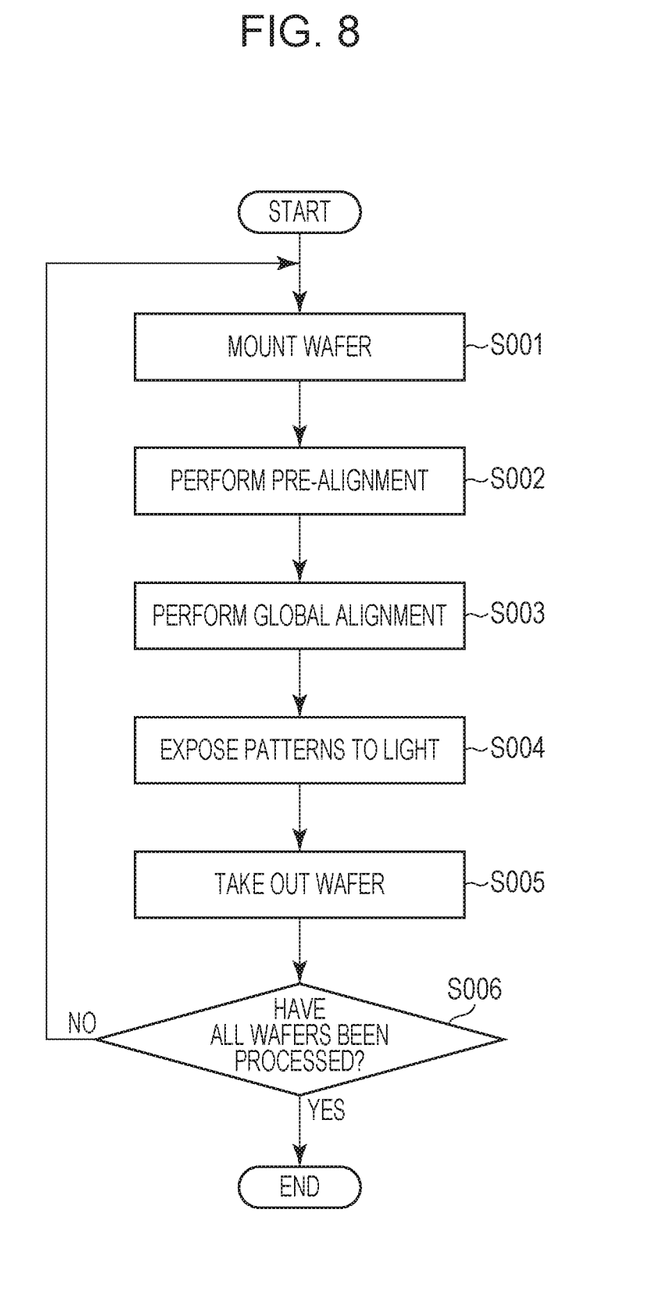
FIG. 8 is a flowchart for a method of exposure according to a sixth embodiment of the present disclosure.

A sixth embodiment will be described with reference to FIG. 8. FIG. 8 is a flowchart for a method of exposure. The sixth embodiment shows a method of adjusting the amount of light and a method for measuring the positions of the marks MA of the present disclosure.

Upon starting the sequence of the method of exposure using the exposure apparatus 100 shown in FIG. 1, a wafer W is mounted on the X-Y stage STG (a wafer chuck CH) (S001). The wafer W mounted on the X-Y stage STG is subjected to pre-alignment at S002 and then global alignment at S003. Here, the pre-alignment and the global alignment are collectively referred to as alignment.

In the pre-alignment at S002, two marks MA formed on the wafer W are detected using a low-power alignment scope (a position detecting apparatus) to measure the positions of the marks MA. The shifts, magnifications, and rotations (rotational components) of the marks MA are roughly acquired from the measurement result to perform alignment necessary for advanced global alignment (AGA).

In the global alignment at S003, the plurality of marks MA formed on the wafer W are detected with a high-power alignment scope (a position detecting apparatus) to measure the positions of the marks MA. By statistically processing the positions of the plurality of marks MA using the measurement results of the marks MA, the positions of the shot areas (arrangement information) on the wafer W are accurately acquired. The position detecting apparatus according to the embodiments of the present disclosure may be used as the alignment scope (the position detecting apparatus) for use in the pre-alignment at S002 and the global alignment at S003. The alignment methods of the above embodiments may be used for measuring the amount of light and for measuring the positions of the marks MA.

At S004, exposure processing is performed on the basis of the position of the shot areas acquired by the global alignment at S003. Upon completion of pattern exposure on all the shot areas, the wafer W is taken out of the exposure apparatus 100 (S005). At S006, it is determined whether all the wafers W have been processed. If it is determined that not all the wafers W have been processed (NO), the process returns to S001, and the next wafer W is conveyed to the exposure apparatus 100. The wafer W conveyed to the exposure apparatus 100 is subjected to measurement alignment for exposure processing. If at S006 it is determined that all the wafers W have been processed (YES), the sequence of the exposure using the exposure apparatus 100 ends.

This is the sixth embodiment of the present disclosure. The sixth embodiment allows higher-speed alignment of wafers by detecting the marks MA using the position detecting apparatus 200 according to the embodiments of the present disclosure, enhancing the throughput (production efficiency).

Known examples of the exposure apparatus 100 of the present disclosure include exposure apparatuses called steppers or scanners. These exposure apparatuses transfer a pattern formed on an original (for example, a reticle) to a plurality of positions (shot areas) of a substrate (for example, a wafer) while driving the substrate step by step. An exposure apparatus that collectively transfers the pattern on shot areas is called a stepper. An exposure apparatus that transfers a pattern on each shot area while scanning the wafer and the reticle is called a scanner. The exposure apparatus 100 is not limited to the known exposure apparatuses (steppers and scanners). Another example of the exposure apparatus 100 is an electron-beam exposure apparatus using charged particle radiation. Still another exposure apparatus 100 is an imprint apparatus that forms a pattern on an imprint material on a substrate using an imprint technique.

While the first embodiment has been described as a position detecting apparatus, an alignment apparatus having the function of detecting a mark on an object to be measured (an object) and aligning the position of the object.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-166056, filed Aug. 25, 2015, which is hereby incorporated by reference herein in its entirety.

What is claimed is:

1. A position detecting apparatus that detects a position of a mark on an object, the apparatus comprising:
   a light receiving element configured to receive light from the mark and accumulate first signals and second signals from the mark;
   a control unit configured to detect a position of the mark based on the light from the mark received by the light receiving element;
   a light source configured to illuminate the mark; and
   an adjusting unit configured to adjust an amount of light applied to the mark,
   wherein the control unit obtains the amount of the light from the mark based on the accumulated first signals in a term overlapping with another term during which the accumulated second signals are transferred to the control unit,
   wherein the control unit, in a case where the amount of the light from the mark is appropriate, detects the position of the mark based on the light from the mark received by the light receiving element and in a case where the amount of the light from the mark is inappropriate, adjusts the amount of light applied to the mark by controlling the adjusting unit.

2. The position detecting apparatus according to claim 1, wherein, if it is obtained that the amount of the light from the mark is inappropriate, the control unit stops accumulation of light from the mark in the light receiving element.

3. The position detecting apparatus according to claim 1, wherein the control unit detects the position of the mark based on light from the mark received by the light receiving element after the amount of light applied to the mark is adjusted by the adjusting unit.

4. The position detecting apparatus according to claim 1, wherein the control unit starts to calculate the amount of light from the mark based on a relationship between a speed at which the amount of light from the mark is calculated and a speed at which the accumulated first signals in the light receiving element are transferred.

5. The position detecting apparatus according to claim 1, wherein the control unit obtains the amount of light from the mark based on the accumulated first signals by the light receiving element and transferred to the control unit in parallel with a term during which the accumulated second signals of the light from the mark by the light receiving element are transferred to the control unit.

6. The position detecting apparatus according to claim 5, wherein the light from the mark is accumulated in the light receiving element a plurality of times,
   wherein, when the control unit detects the position of the mark based on the accumulated first signals of the light from the mark, the first signals being accumulated in the light receiving element a plurality of times, the control unit obtains the amount of the light from the mark based on the signals accumulated in the light receiving element and transferred to the control unit in parallel with a term in which the light from the mark is accumulated in the light receiving element and a term in which the accumulated second signals from the mark are transferred to the control unit.

7. An exposure apparatus that exposes a pattern on an original onto a substrate, the apparatus comprising the position detecting apparatus according to claim 1, wherein the substrate is aligned by detecting a position of mark on the substrate using the position detecting apparatus.

8. A method for detecting a position of a mark on an object, the method comprising the steps of:
   illuminating the mark and accumulating first signals and second signals from the mark;

determining an amount of the light from the mark based on the accumulated first signals in parallel with the step of accumulating the second signals; and detecting, in a case where the amount of light applied to the mark is appropriate, the position of the mark based on the light from the mark received by the light receiving element, and, adjusting, in a case where the amount of the light from the mark is inappropriate, the amount of light applied to the mark by controlling an adjusting unit.

9. A position detecting apparatus that detects a position of a mark on an object, the apparatus comprising:
   a light receiving element configured to receive light from the object and accumulate signals corresponding to the received light;
   a control unit configured to detect a position of the mark based on the accumulated signals from the light receiving element;
   a light source configured to illuminate the object; and
   an adjusting unit configured to adjust an amount of light illuminating the object,
   wherein the control unit obtains an amount of light based on first accumulated signals from the light receiving element transferred to the control unit in a term overlapping with a term during which second accumulated signals are transferred to the control unit,
   wherein the control unit, in a case where the obtained amount of the light is appropriate, detects the position of the mark based on the accumulated signals from the light receiving element and in a case where the obtained amount of the light is inappropriate, adjusts the amount of light illuminating the object by controlling the adjusting unit.

10. The position detecting apparatus according to claim 9, wherein, if the obtained amount of the light is inappropriate, the control unit stops accumulation of signals from the light receiving element.

11. The position detecting apparatus according to claim 9, wherein the control unit detects the position of the mark based on the accumulated signals from the light receiving element after the amount of light illuminating the object is adjusted by the adjusting unit.

12. The position detecting apparatus according to claim 9, wherein the control unit starts to calculate the amount of light based on a relationship between a speed at which the amount of light is calculated and a speed at which the first accumulated signals in the light receiving element are transferred.

13. The position detecting apparatus according to claim 9, wherein the control unit obtains the amount of light based on the first accumulated signals by the light receiving element and transferred to the control unit in parallel with a term during which the second accumulated signals of the light by the light receiving element are transferred to the control unit.

14. The position detecting apparatus according to claim 13,
   wherein the accumulated signals is accumulated in the light receiving element a plurality of times,
   wherein, when the control unit detects the position of the mark based on the first accumulated signals of the light, the first accumulated signals being accumulated in the light receiving element a plurality of times, the control unit obtains the obtained amount of the light based on the signals accumulated in the light receiving element and transferred to the control unit in parallel with a term in which the accumulated signals is accumulated in the light receiving element and a term in which the second accumulated signals from the mark are transferred to the control unit.

15. An exposure apparatus that exposes a pattern on an original onto a substrate, the apparatus comprising the position detecting apparatus according to claim 9, wherein the substrate is aligned by detecting a position of the substrate using the position detecting apparatus.

16. A method for detecting a position of a mark on an object, the method comprising the steps of:
   illuminating the object and accumulating first signals and second signals from the object;
   obtaining an amount of the light based on the first accumulated signals in parallel with the step of accumulating the second accumulated signals; and
   obtaining, in a case where the obtained amount of light is appropriate, detecting the position of the mark based on the accumulated signals from the light receiving element, and, adjusting, in a case where the obtained amount of the light is inappropriate, the amount of light illuminating the object by controlling an adjusting unit.

* * * * *